(12) United States Patent
Beck

(10) Patent No.: US 11,061,083 B1
(45) Date of Patent: Jul. 13, 2021

(54) METHOD FOR MAXIMUM-ENTROPY MOBILITY SPECTRUM ANALYSIS

(71) Applicant: U.S. Army Combat Capabilities Development Command, Army Research Labortary, Adelphi, MD (US)

(72) Inventor: William A. Beck, Woodbine, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/872,413

(22) Filed: May 12, 2020

(51) Int. Cl.
*G01R 33/07* (2006.01)
*G01R 15/20* (2006.01)

(52) U.S. Cl.
CPC ........... *G01R 33/07* (2013.01); *G01R 15/202* (2013.01)

(58) Field of Classification Search
CPC ..... G01R 33/07; G01R 15/202; G01N 27/622
See application file for complete search history.

(56) References Cited

U.S. PATENT DOCUMENTS

| | | | |
|---|---|---|---|
| 5,789,931 A | 8/1998 | Meyer et al. | |
| 6,100,704 A * | 8/2000 | Meyer | G01R 31/2648 324/251 |
| 6,791,339 B2 | 9/2004 | Licini et al. | |
| 7,109,724 B2 | 9/2006 | Eberhardt et al. | |
| 8,207,748 B2 * | 6/2012 | Blew | G01R 31/2648 324/637 |
| 10,551,427 B2 | 2/2020 | Beck | |

(Continued)

FOREIGN PATENT DOCUMENTS

DE 4231392 A1 3/1994

OTHER PUBLICATIONS

Antoszewski, J., et al., "Quantitative mobility spectrum analysis (QMSA) in multi-layer semiconductor structures," Opto-Electronics Review, 12(4), 2004, pp. 347-352.

(Continued)

*Primary Examiner* — Alvaro E Fortich
(74) *Attorney, Agent, or Firm* — Alan I. Kalb (57) ABSTRACT

Determining a distribution of carrier mobilities in a material of an electronic device includes acquiring a magnetic field-dependent Hall measurement of the material exposed to a finite number of magnetic fields, wherein the magnetic field-dependent Hall measurement includes an electrical signal generated in response to the finite number of magnetic fields being applied perpendicular to a current through the material; and processing the magnetic field-dependent Hall measurement, using a computer, to determine a continuous, least-biased distribution of carrier mobilities that match the magnetic field-dependent Hall measurement by determining, using the magnetic field-dependent Hall measurement, a probability density function of a conductance of the material; approximating the mobility spectrum to a maximum-entropy spectrum of the material; and determining an energy dependence of carrier scattering in the material based on the maximum-entropy spectrum. The final maximum-entropy mobility spectrum identifies a least-biased estimate of the distribution of the carrier mobilities in the material.

20 Claims, 7 Drawing Sheets

(56) References Cited

U.S. PATENT DOCUMENTS

2014/0343870 A1    11/2014    Martel et al.
2018/0231602 A1*    8/2018    Beck .................. G01R 33/1253

OTHER PUBLICATIONS

Antoszewski, J., et al., "Application of Quantitative Mobility-Spectrum Analysis to Multilayer HgCdTe Structures," Journal of Electronic Materials, vol. 33, No. 6, 2004, pp. 673-683.

Antoszewski, J., et al., "Comment on 'Mobility spectrum computational analysis using a maximum entropy approach'," Physical Review E 69, 2004, pp. 038701-1 to 038701-2.

Antoszewski, J., et al., "Magneto-Transport Characterization Using Quantitative Mobility-Spectrum Analysis," Journal of Electronic Materials, vol. 24, No. 9, 1995, pp. 1255-1262.

Antoszewski, J., et al., "High Resolution Mobility Spectrum Analysis of Multi-Carrier Transport in Advanced Infrared Materials," Journal of Electronic Materials, Oct. 2012, pp. 1-17.

Beck, W., et al., "Determination of electrical transport properties using a novel magnetic field-dependent Hall technique," Journal of Applied Physics, 62(2), Jul. 15, 1987, pp. 541-554.

Beck, W., et al., "Determination of Heterojunction Mobilities Using a Novel Magnetic Field-Dependent Hall Technique," Journal of Crystal Growth 81, 1987, pp. 136-143.

Chrastina, D., et al., "Application of Bryan's algorithm to the mobility spectrum analysis of semiconductor devices," Journal of Applied Physics 94(10), Sep. 2003, pp. 1-9.

Cui, B., et al., "Introducing Fourier-domain mobility spectrum analysis (FMSA) to deduce multi-component carrier mobility and density," Proc. of Spie—The International Society for Optical Engineering, vol. 9370, Quantum Sensing and Nanophotonic Devices XII, Feb. 8, 2015, pp. 937030-1 to 937030-8.

Dziuba, Z., et al., "Analysis of the electrical conduction using an iterative method," Journal de Physique III, EDP Sciences, 1992, 2 (1), pp. 99-110.

Kiatgamolchai, S., et al., "Mobility spectrum computational analysis using a maximum entropy approach," Physical Review E 66, Sep. 27, 2002, pp. 036705-1 to 036705-9.

Meyer, J., et al., "Quantitative mobility spectrum analysis of multicarrier conduction in semiconductors," Journal of Applied Physics, vol. 81, No. 2, Jan. 15, 1997, pp. 709-713.

Mironov, O., et al., "Reply to 'Comment on 'Mobility spectrum computational analysis using a maximum entropy approach''," Physical Review E 69, Mar. 11, 2004, pp. 038702-1 to 038702-2.

Rothman, J., et al., "Maximum Entropy Mobility Spectrum Analysis of HgCdTe Heterostructures," Journal of lectronic Materials, vol. 35, No. 6, 2006, pp. 1174-1184.

Umana-Membreno, G., et al., "Investigation of Multicamer Transport in LPE-Grown Hg1-xCdxTe Layers," Journal of Electronic Materials, vol. 39, No. 7, 2010, pp. 1023-1029.

Urrea, M., et al., "The Nevanlinna Theorem of the Classical Theory of Moments Revisited," Journal of Applied Analysis, vol. 7, No. 2, Mar. 16, 2001, pp. 209-224.

Vurgaftman, I., et al., "Improved quantitative mobility spectrum analysis for Hall characterization," Journal of Applied Physics, vol. 84, No. 9, Nov. 1, 1998, pp. 4966-4973.

Vurgaftman, I., et al., "Quantitative Mobility Spectrum Analysis (QMSA) for Hall Characterization of Electrons and Holes in Anisotropic Bands," Journal of Electronic Materials, vol. 28, No. 5, 1999, pp. 548-552.

Kiatgamolchai, S., et al., "Maximum-Entropy Mobility Spectrum of Two-Dimensional Hole Gas in Strained-Si1-xGex/Si Heterostructures, " Thesis, The University of Warwick, Jun. 2000, 213 pages.

Du, G., et al., "Characterizing Multi-Carrier Devices with Quantitative Mobility Spectrum Analysis and Variable Field Hall Measurements," Japanese Journal of Applied Physics, vol. 41, Part 1, No. 2B, 2002, 10 pages.

Ashcroft, N., et al., "Solid State Physics," Textbook, W. B. Saunders Company, 1976, p. 12.

* cited by examiner

METHOD FOR MAXIMUM-ENTROPY MOBILITY SPECTRUM ANALYSIS

GOVERNMENT INTEREST

The embodiments herein may be manufactured, used, and/or licensed by or for the United States Government without the payment of royalties thereon.

BACKGROUND

Technical Field

The embodiments herein generally relate to analyzing electronic devices, and more particularly to determining a carrier mobility analysis in the material of the electronic devices.

Description of the Related Art

Modern electronic devices use semiconductor structures designed using multiple layers with different electronic and optical properties. Therefore, it may be necessary to combine dissimilar layers in manufacturing electronic devices. However, combining dissimilar layers sometimes leads to creation of new charge ensembles, which may be to the benefit or harm of the functionality of the structure in device applications. It is therefore desirable to be able to distinguish and characterize the properties of each such layer.

One method that may be used in the characterization of semiconductor materials is a Hall effect measurement. The Hall effect measurement measures the transverse and longitudinal voltages created when a magnetic field is applied perpendicular to a current through the material under study. The Hall effect measurement may be used to determine parameters such as carrier mobility and carrier density and thereby characterize the semiconductor material.

Some conventional methods for evaluating properties of the material of an electronic device by analyzing the data from a magnetic field-dependent Hall effect measurement may favor narrow mobility peaks in the results, but such methods often exclude other valid solutions, thereby giving a misleading result to the user. Furthermore, some conventional methods do not consider noise uncertainties in the measurement so that the user has no idea of the uncertainty in the derived carrier properties.

There are broad techniques for mobility spectrum analysis, and more specific techniques for maximum-entropy mobility spectrum analysis. Previously, the techniques available to deduce multiple carrier mobilities from a magnetic field-dependent Hall measurement were all multicarrier fitting techniques, in which the user assumes some specific number of carrier types and varies the mobility and density of those carriers to achieve the best fit to the Hall data. The motivation for some MSA techniques has generally been to achieve narrower peaks (more narrowly defined mobilities) in the spectrum than occur in the previous MSA techniques, which are then seen as more quantitative. However, the techniques generally do this by zeroing in on a specific solution that fits the Hall data, but implicitly excluding other solutions that also fit the data. The results can therefore sometimes be misleading to a user.

Additionally, the conventional methods for determining the spectrum of carrier mobilities from a magnetic field-dependent Hall measurement typically either explicitly yield a set of discrete carriers or yield a continuous spectrum that is biased toward yielding sharp peaks that are nearly equivalent to discrete carriers. These previous techniques generally have not been demonstrated to recover a broad distribution of mobilities such as occurs due to a variety of mechanisms, including energy-dependent carrier scattering. Other maximum-entropy methods may recover broad mobility distributions, but they require large numbers of magnetic fields (typically >30) and require numerical convergence over hundreds or thousands of iterations, which are impractical to use in industry.

SUMMARY

In view of the foregoing, the embodiments herein provide a method for determining a distribution of carrier mobilities in a material of an electronic device, and a non-transitory program storage device readable by computer, and comprising a program of instructions executable by the computer to perform the method for determining a distribution of carrier mobilities in a material of an electronic device. The method comprises acquiring a magnetic field-dependent Hall measurement of the material of the electronic device exposed to a finite number of magnetic fields, wherein the magnetic field-dependent Hall measurement comprises an electrical signal generated in response to the finite number of magnetic fields being applied perpendicular to a current through the material; and processing the magnetic field-dependent Hall measurement, using a computer, to determine a continuous, least-biased distribution of carrier mobilities that match the magnetic field-dependent Hall measurement by: determining, using the magnetic field-dependent Hall measurement, a probability density function of a conductance of the material of the electronic device; approximating the mobility spectrum to a maximum-entropy spectrum of the material; and determining an energy dependence of carrier scattering in the material based on the maximum-entropy spectrum, wherein the maximum-entropy mobility spectrum identifies a least-biased estimate of the distribution of the carrier mobilities in the material.

The method may further comprise determining a source of a dominant carrier scattering in the material based on the energy dependence. The method may further comprise plotting a representation of the mobility spectrum comprising peaks comprising (i) a position and amplitude that indicates the carrier mobilities and densities of the discrete carriers, and (ii) a width that are directly indicative experimental uncertainties in the carrier mobilities. The finite number of magnetic fields may comprise seven or fewer magnetic fields. Positive-definite Hall data of the magnetic field-dependent Hall measurement may be exactly fit by one-dimensional continuum of N-carrier sets, and wherein N is an integer. The magnetic field-dependent Hall measurement may comprise physical data and unphysical data, and the method may comprise converting the unphysical data to a positive definite approximation of the unphysical data.

The converting of the unphysical data to the positive definite approximation of the unphysical data may comprises (a) determining a closest whitened positive-definite A-matrix with a minimum positive eigenvalue; (b) determining a closest Hankel matrix; and (c) determining a positive-definite Hankel matrix corresponding to a closest physical set of Hall data based on (a) and (b). The whitened positive-definite A-matrix with a minimum positive eigenvalue may depend on noise in the magnetic field-dependent Hall measurement. The probability density function may describe a mobility spectrum of a linear combination of discrete carriers. The probability density function may describe a mobility spectrum of a linear combination of continuous carriers.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Beck, W., et al. "*Determination of electrical transport properties using a novel magnetic field-dependent Hall technique,*" J. Appl. Phys. 1987; 62:541 (hereinafter "Beck"), the contents of which in its entirety is incorporated herein by reference, describes a mobility spectrum analysis (MSA). The embodiments herein demonstrate the problem of determining the mobility spectrum from a set of Hall measurements at a finite number of magnetic fields, and which can be transformed into a form that is equivalent to the classical truncated Hamburger moment problem of determining a positive function from its first moments. This permits classification of Hall data as either physical, with a continuum of exact solutions, or unphysical, with no solutions. Moreover, the embodiments herein describe the relationship between multicarrier mobility spectrum analysis (MMSA) method and a newly presented maximum-entropy method. As such, the new method provided by the embodiments herein determine a maximum-entropy solution for physical data and then provide a way of applying the method to initially unphysical data by finding a "close" physical approximation. Moreover, the embodiments herein provide a method for calculating a continuous, least-biased distribution of carrier mobilities that matches a set of magnetic field-dependent Hall data. The derived distribution may be used for analyzing materials with a continuous distribution of mobilities, but can also be used for materials that have a limited number of discrete carriers. The embodiments herein may be used to assist and accelerate the development of improved electronic materials that can then be used in a variety of electronic devices for various purposes and applications. Referring now to the drawings, and more particularly to FIGS. 1 through 7, where similar reference characters denote corresponding features consistently throughout the figures, there are shown preferred embodiments.

The embodiments herein provide a technique for calculating a continuous, least-biased distribution of carrier mobilities that matches a set of magnetic field-dependent Hall data. The derived distribution may be used for analyzing materials with an actual continuous distribution of mobilities as well as materials that have a limited number of discrete carriers. Such carrier information is crucial for the development of materials for a wide range of electronic and optoelectronic devices. The technique provided by the embodiments herein complements known methods for multicarrier mobility spectrum analysis (MMSA). While the MMSA excels at extracting descriptions of measured Hall data in terms of discrete carriers, the maximum-entropy method provided by the embodiments herein determines a continuous spectrum of mobilities and can reproduce the width and shape of broad and narrow mobility peaks with only a small (i.e., seven or fewer) number of magnetic fields. The method provided by the embodiments herein reliably recovers from a small number of magnetic fields, the broad, continuous distribution of mobilities that results from mechanisms like energy-dependent scattering, so that it could be used to directly characterize scattering mechanisms in conventional or topological materials. In addition, for samples that contain discrete carriers, the method provided by the embodiments herein can compute peaks whose position and amplitude correspond to the mobility and carrier density of those carriers and in which the widths of the peaks indicate the uncertainties in the mobilities.

Figure 1:
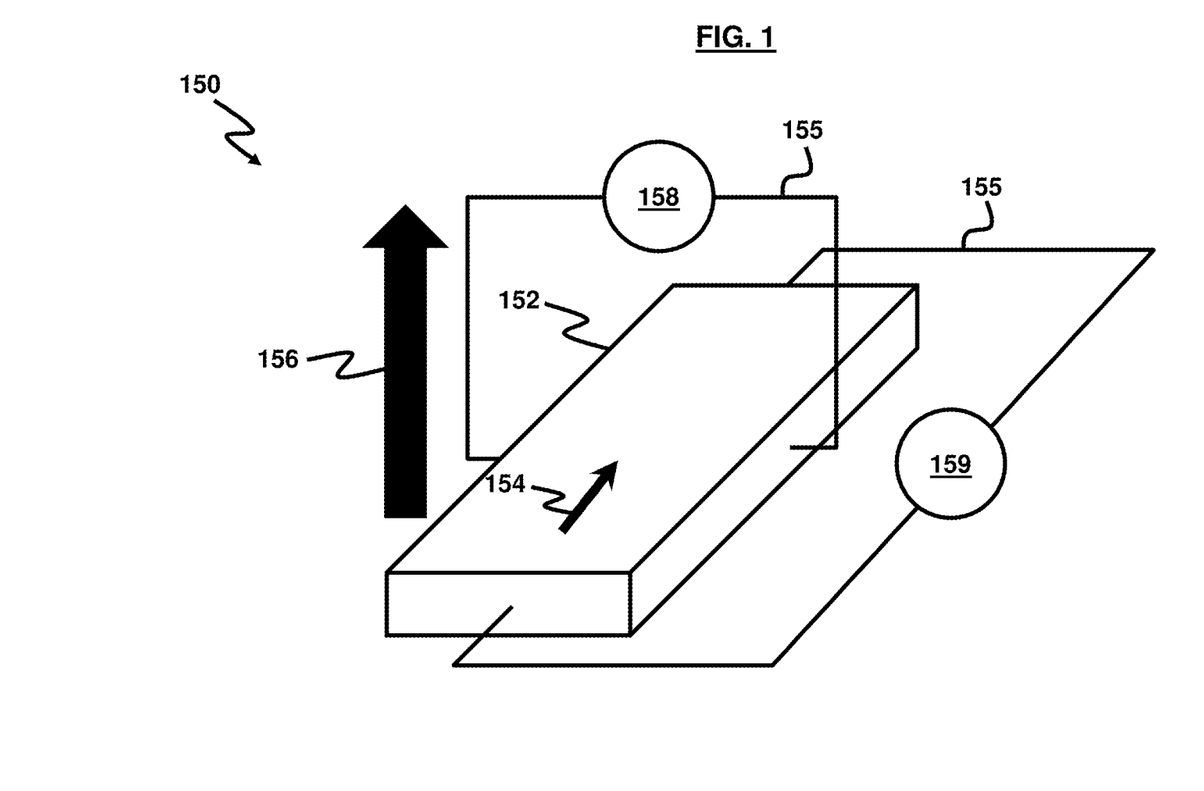
FIG. 1 is a schematic diagram illustrating a circuit for performing Hall effect measurement on a semiconductor device and which may be used in accordance with the embodiments herein.

FIG. 1 is a schematic diagram illustrating a circuit 150 for Hall measurement as used in accordance with an embodiment herein. As illustrated in FIG. 1, an electric current 154 may be applied to a semiconductor material 152. A magnetic field 156 may also be applied to the semiconductor material 152 in a direction perpendicular to the semiconductor material 152. The Hall effect generated by the interaction of the current 154 and the magnetic field 156 may be in the form of one or more electrical signal(s) 155, which may be measured by measurement devices 158, 159, which may be configured as voltmeters. In one embodiment, a single voltmeter may be used for both of the measurement devices 158 and 159 by sequentially connecting to the semiconductor material 152 in the locations the measurement devices 158 and 159 are connected. In an embodiment herein, the Hall measurement involves measuring the voltage transverse to the current using device 158 and along the current using device 159 as the magnetic field 156 is adjusted to a set of values. Variations of this geometry including the van der Pauw and Hall bar geometries can also be used to obtain equivalent information.

Beck describes that for the mobility spectrum analysis (MSA), and for a broad range of sample types, the conductivity in a material can be described in terms of a continuous mobility spectrum, $s(\mu)$, by the integral transform:

$$\sigma_{xx}(H) = \int_{-\infty}^{\infty} \frac{s(\mu) d\mu}{1 + (\mu H)^2} \quad (1)$$

$$\sigma_{xy}(H) = \int_{-\infty}^{\infty} \frac{\mu H s(\mu) d\mu}{1 + (\mu H)^2}, \quad (2)$$

where $\mu$ is mobility, H is magnetic field, $\sigma_{xx}$ and $\sigma_{xy}$ are the elements of the conductivity tensor, and where negative mobilities correspond to electrons and positive mobilities correspond to holes. Here, $s(\mu)$ must be $\geq 0$ at all $\mu$ for a physical spectrum. Beck also showed that, for a set of Hall data specified as $\sigma_{xx}(H)$ and $\sigma_{xy}(H)$ at a discrete set of N magnetic fields $\{H_i\}$ with $H_1=0$, there is at least one physical mobility spectrum $s(\mu) \geq 0$ if, and only if, the N×N A-matrix defined by:

$$A_{ij} = \begin{cases} \sum_{k=1}^{N} (\sigma_{xx})_k (C_R^{-1})_{k,(i+j)/2}, & (i+j) \text{ even} \\ \sum_{k=2}^{N} (\sigma_{xy})_k (C_I^{-1})_{k-1,(i+j-1)/2}, & (i+j) \text{ odd} \end{cases} \quad (3)$$

has no negative eigenvalues. $C_R^{-1}$ and $C_I^{-1}$ are N×N and (N−1)×(N−1) matrices, respectively, that are determined from the set of $\{H_i\}$. The sum over $\sigma_{xy}(H_i)$ skips the first element, $H_1=0$, since $\sigma_{xy}(0)=0$. Therefore, evaluation of the eigenvalues of A yields a test for physical data: If the eigenvalues are all non-negative then the Hall data corresponds to at least one physical $s(\mu) \geq 0$. If any eigenvalues are negative, then there are no physical solutions. In the special case of m positive eigenvalues and (N−m) zero eigenvalues, there is a single physical solution comprising of m discrete carrier mobilities.

A is a Hankel matrix in which the value of each element is dependent only on the sum of the indices (i+j). Therefore, A can be written more compactly in terms of a (2N−1)-long a-vector with $a_{i+j-1} = A_{ij}$. Then, if the N measured $\sigma_{xx}(H)$ is joined with the (N−1) measured $\sigma_{xy}(H)$ (skipping the first element, $\sigma_{xy}(H_1)=0$) into a single vector $\sigma$, and use Eq. (3), a can be written as:

$$a = S \cdot \sigma \quad (4)$$

where S is a matrix whose elements depend only on the set of magnetic fields $\{H_i\}$. As long as the fields in $\{H_i\}$ are all distinct, S is non-singular, and Eq. (4) represents a reversible linear relationship between a and the measured $\sigma$, so that the a-vector can be used as an equivalent representation of the Hall data. Furthermore, the error covariance matrix $X_a$ for the elements of the derived a-vector is directly related to the covariance matrix $X_\sigma$ for the elements of the measured $\sigma$ through $X_a = S^T X_\sigma S$. Then, the $\chi^2$ computed from either $\delta\sigma$ or $\delta a = S \cdot \delta\sigma$ is the same:

$$\chi^2 = (\delta a) X_a (\delta a) = ((\delta\sigma) S^T) X_a (S(\delta\sigma)) = (\delta\sigma)(S^T X_a S)(\delta\sigma) = (\delta\sigma) X_\sigma (\delta\sigma). \quad (5)$$

Beck also showed that the envelope of all possible physical $s(\mu)$ that are consistent with the data is determined by:

$$s(\mu) = \frac{|v_\mu|^2}{\alpha_\mu} \left( \sum_{i=1}^{N} \frac{\left(\sum_{j=1}^{N} Q_{ij}(v_\mu)_j\right)^2}{\lambda_i} \right)^{-1}, \quad (6)$$

where $\{\lambda_i\}$ are the eigenvalues of A, Q is an orthogonal matrix whose columns are the eigenvectors of A, $$\alpha_\mu = \frac{\sigma_0}{\prod_{\rho=1}^{N}(1 + H_\rho^2 \mu^2)} \sum_{j=0}^{N-1} \mu^{2j} \quad (7)$$

and $$v_\mu = (1, -\mu, \mu^2, -\mu^3, \ldots, (-\mu)^{N-1}) \quad (8)$$

The $s(\mu)$ from Eq. (6) is the maximum conductivity of a carrier with mobility $\mu$ in the full set of solutions that match the Hall data. More specifically, it can be shown that the solutions along the envelope spectrum all comprise N discrete carriers, and all of those carriers have conductivity and mobility somewhere on the envelope spectrum.

As used herein, the term "closest" is a quantitate term in that it is determined by the minimum chi-squared deviation between the original data and the "closest" physical A-matrix. The closest physical $A_p$ to an unphysical, measured $A_d$ is always an A-matrix that corresponds to a set of m discrete carriers. This is because unphysical A-matrices have one or more negative eigenvalues while physical A-matrices have eigenvalues that are either positive or zero. The boundary between physical and unphysical A-matrices comprises of A-matrices with at least one zero eigenvalue and the rest of the eigenvalues positive. Since the closest $A_p$ must lie on the boundary, the closest $A_p$ has $z \geq 1$ zero eigenvalues, which corresponds to $m = N - z$ discrete carriers. Therefore, although a general, physical A-matrix corresponds to a continuous spectrum of carrier mobilities, the closest physical spectrum to an unphysical measurement always comprises a finite set of discrete carrier mobilities.

An aspect of the embodiments herein is the recognition that the Hall problem of recovering $s(\mu)$ from $\sigma_{xx}$ and $\sigma_{xy}$ measured at a finite number of magnetic fields can be put in a form that is equivalent to the classical truncated Hamburger moments problem of recovering a function from a finite number of its first moments. To see this, note that the a-vector for a discrete set of carriers with mobility $\mu_0$ and conductivity $s_0$ is:

$$a = \frac{s_0}{\prod_{\rho=1}^{N}(1 + H_\rho^2 \mu^2)} \{1, -\mu_0, \mu_0^2, -\mu_0^3, \ldots, -\mu_0^{2N-1}\}, \quad (9)$$

so the a-vector for a continuous distribution of mobilities with conductivity density s(µ) is:

$$a\{m_0,-m_1,m_2,-m_3,\ldots,-m_{2N}\}, \qquad (10)$$

where $m_i$ is the $i^{th}$ moment:

$$m_i = \int_{-\infty}^{\infty} \mu^i g(\mu) d\mu. \qquad (11)$$

of the scaled function:

$$g(\mu) = \frac{s(\mu)}{\prod_{p=1}^{N}(1+H_p^2\mu^2)}. \qquad (12)$$

From the theory of the truncated Hamburger moment problem:

1. When the matrix of moments, which is equivalent to the A-matrix, has any negative eigenvalues, there are no positive functions g(µ) that generate the moments.
2. When the matrix of moments is positive semi-definite, i.e., has p positive and z zero eigenvalues, but no negative eigenvalues, there is a unique solution for g(µ) that comprises of p δ-functions. For the Hall problem, this is p discrete carriers.
3. When the matrix of moments is positive definite, with all positive eigenvalues, there are an infinite number of solutions for g(µ) that yield the specified moments. These statements are all consistent with the previous statements based on the A-matrix.

U.S. Pat. No. 10,551,427 entitled "Method for Multicarrier Mobility Spectrum Analysis" (hereinafter, "the '427 patent"), the contents of which in its entirety is incorporated herein by reference, addresses the first case in which measured Hall data has some number of slightly negative eigenvalues. In that case, there are no physical solutions that exactly match the measured data, but there is a discrete-carrier solution that is statistically closest to the measured data. MMSA provides a fast and robust method to calculate that closest set of discrete carriers and to relate the uncertainty in the discrete carrier properties to the uncertainties in the measured data.

The embodiments herein address the third case in which all of the eigenvalues are positive, referred to herein as positive-definite data. Such a case can occur when the sample contains a continuous distribution of mobilities, for example due to an energy-dependent scattering mechanism. Since there are an infinite number of possible mobility spectra, s(µ), that match the Hall data in this case, the goal of the method is to extract a high-entropy particular mobility spectrum that makes the fewest assumptions about the solution. The embodiments herein generate a spectrum that is a linear combination of N-carrier solutions, with the weights of each N-carrier solution chosen so that all of the N-carrier solutions are equally likely. The resultant smooth spectrum gives an unbiased representation of the conductivity in the sample and is shown to agree with the expected answer for synthetic Hall data generated for a known energy-dependent scattering mechanism.

Figure 2:
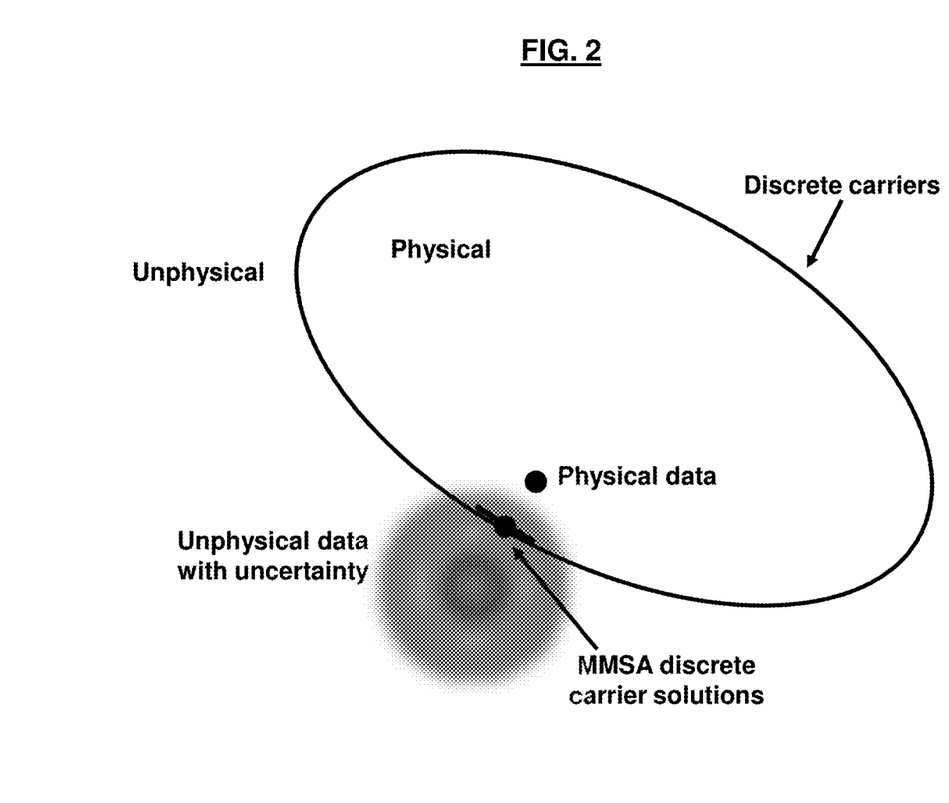
FIG. 2 is a schematic diagram illustrating a region of physical Hall data surrounded by a region of unphysical data, according to an embodiment herein.

Moreover, the embodiments herein provide a method for converting slightly unphysical data (i.e., data with one or more small negative eigenvalues) to positive-definite data so that the method described above can be applied to extract a continuous mobility spectrum that represents the conductance in the sample. The resultant continuous spectrum complements the multicarrier mobility spectra described in the '427 patent, and provides an alternate way of viewing and understanding data from samples with a set of discrete carriers. FIG. 2 shows a schematic diagram that illustrates the various types of data and the types of solutions found by the MMSA and the maximum-entropy methods provided by the embodiments herein. In particular, FIG. 2 shows a convex region of physical Hall data (A-matrix has all positive eigenvalues, many physical solutions) surrounded by the region of unphysical data (A-matrix has one or more negative eigenvalues, no physical solutions), separated by a boundary with a mixture of positive and zero eigenvalues and unique multicarrier solutions. The circular gradient represents slightly unphysical Hall data and its uncertainty. The MMSA method finds the multicarrier solutions along the boundary, while the maximum-entropy (MEMSA) method provided by the embodiments herein finds the maximum-entropy solution for a nearby physical data point (or for the data itself, if already physical).

Figure 3:
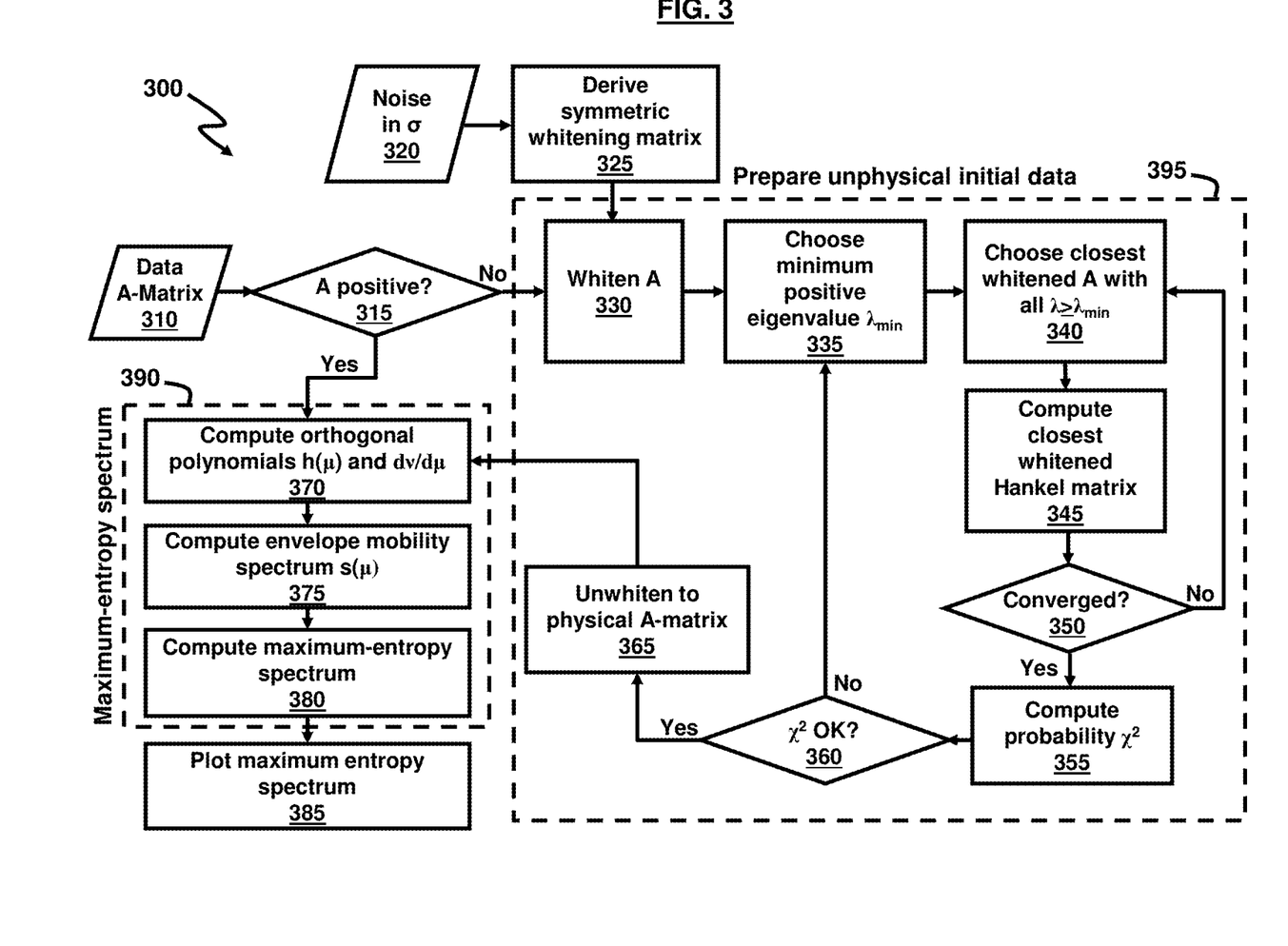
FIG. 3 is a flowchart illustrating a method for determining the maximum-entropy mobility spectrum, according to an embodiment herein.

FIG. 3 is a flow diagram illustrating a method 300 for determining the full maximum-entropy mobility spectrum. Initial data that is physical, with a positive-definite A-matrix 310, can be immediately processed by the procedure in the box 390 and labeled "Maximum-entropy spectrum," which is described further below. Data that is initially unphysical is converted to a physical approximation by the steps in the box 395 and labeled "Prepare unphysical initial data," which is further described below. The first step 325, indicated by the first row in FIG. 3, determines a matrix W for symmetrically whitening the A-matrices at step 330. A data A-matrix 310 may be provided and at step 315 it is determined whether A is positive. If it is not positive, then the method 300 enters the process of box 395 at step 330. If it is positive, then the process enters box 390 at step 370, as further described below. The symmetric, whitened matrix $A_W=W^TAW$ has noise statistics 320 such that the expectation of the square of the noise is an identity matrix; i.e., $$\left\langle (\delta A_W^T)(\delta A_W) \right\rangle = I_N, \qquad (1)$$

where $\delta A_W$ is the noise variation in $A_W$, $\delta A_W^T$ is the transpose of $\delta A_W$, and $I_N$ is the N×N identity matrix. The whitened $A_W$ at step 330 has the same matrix inertia as A; i.e., the same number of positive, zero, and negative eigenvalues, so that $A_W$ is physical (non-negative definite) if, and only if, A is physical. The whitening matrix depends only on the uncertainty (noise) in the Hall data at the set of $\{H_i\}$ used for the measurement, and so it need only be computed once at the beginning of the method 300. The method 300 may then, at step 335, choose the minimum positive eigenvalue $\lambda_{min}$, and then at step 340, find the closest whitened A-matrix with all $\lambda \geq \lambda_{min}$. Next, the method 300 computes the closest whitened Hankel matrix 345. Once a closest whitened Hankel matrix is found it is determined whether the process is converged at step 350. If the process is not converged, then the process reverts back to step 340. If the process is converged, then the method 300 proceeds to compute the probability $\chi^2$ at step 355. Next, at the decision step 360, it is determined whether the probability $\chi^2$ is 'ok' within a selected, defined parameter. If it is not 'ok', then the method 300 reverts back to step 335. If it is 'ok', then the method 300 unwhitens the result to a physical A-matrix at step 365. Thereafter, the method 300 has completed the preparation of the unphysical initial data from box 395 and enters the determination of the maximum-entropy spectrum in box 390. First, the method 300 computes orthogonal polynomials h(µ) and dv/dµ at step 370. Moreover, the method 300 may also directly proceed to step 370 from step 315, as described above. Next, the envelope mobility spectrum $s(\mu)$ is computed at step 375. Thereafter, the maximum-entropy spectrum is computed at step 380. Finally, the method 300 plots the maximum entropy spectrum at step 385.

Example: Acoustic Phonon Scattering

The method provided by the embodiments herein may be used for analyzing material in which there is continuous distribution of mobilities. Such a case arises when carrier scattering is dominated by an energy dependent scattering mechanism. For example, when scattering is dominated by interaction with acoustic phonons, scattering time (and therefore mobility) varies as $\mu=\mu_0 x^{-1/2}$, with x=E/kT, E in the energy from the band edge, k is Boltzmann's constant, and T is temperature. For a non-degenerate band, carrier density decreases exponentially away from band edge as $(n/n_0)=\text{Exp}(-x)=\text{Exp}[-(\mu_0/\mu)^2]$. Combining these yields a conductivity density spectrum that is zero for $\mu<0$, and:

$$\sigma(\mu) = \frac{\alpha}{(\mu/\mu_0)^6} \exp\left[-\frac{1}{(\mu/\mu_0)^2}\right] \text{ for } \mu \geq 0, \quad (14)$$

where $\alpha$ is a constant.

Figure 4:
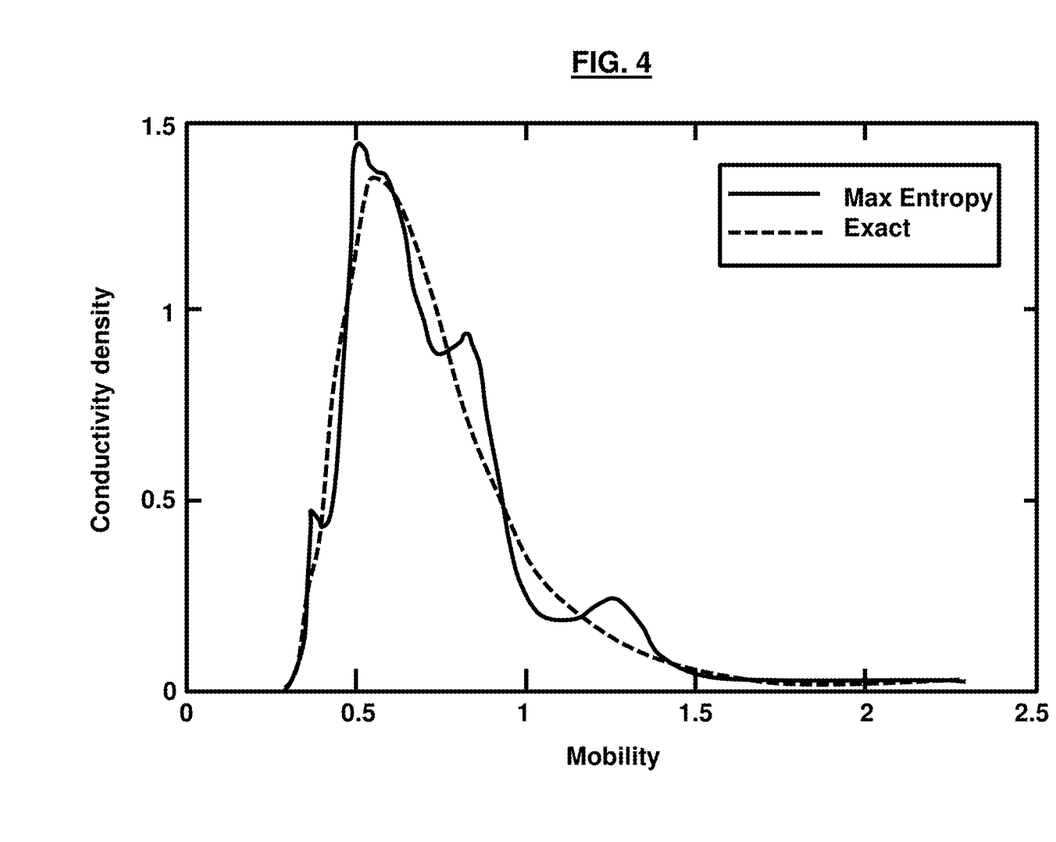
FIG. 4 is a graph illustrating the maximum-entropy and exact mobility spectra for synthetic Hall data calculated for acoustic phonon scattering, according to an exemplary embodiment herein.

To verify that the maximum-entropy method provided by the embodiments herein recovers the known spectrum, synthetic Hall data was experimentally calculated for the spectrum in Eq. (14) at seven uniformly-spaced magnetic fields up to 2 T, and using $\mu_0=1$ m$^2$/V–s with $\alpha=1$. That data was positive definite and was directly processed using the procedure further described below. The result in FIG. 4 shows that the maximum-entropy spectrum is an excellent approximation to the original, exact spectrum. Analysis of this type could be used to determine the type of scattering that dominates in a sample. The small oscillations around the original spectrum arise from using a finite number of magnetic fields (and corresponding finite number of moments of the spectrum) and are similar to the oscillations that occur when reproducing a spectrum from a finite number of Fourier components.

Example: Measured Data from InAsSb Sample

Figure 5:
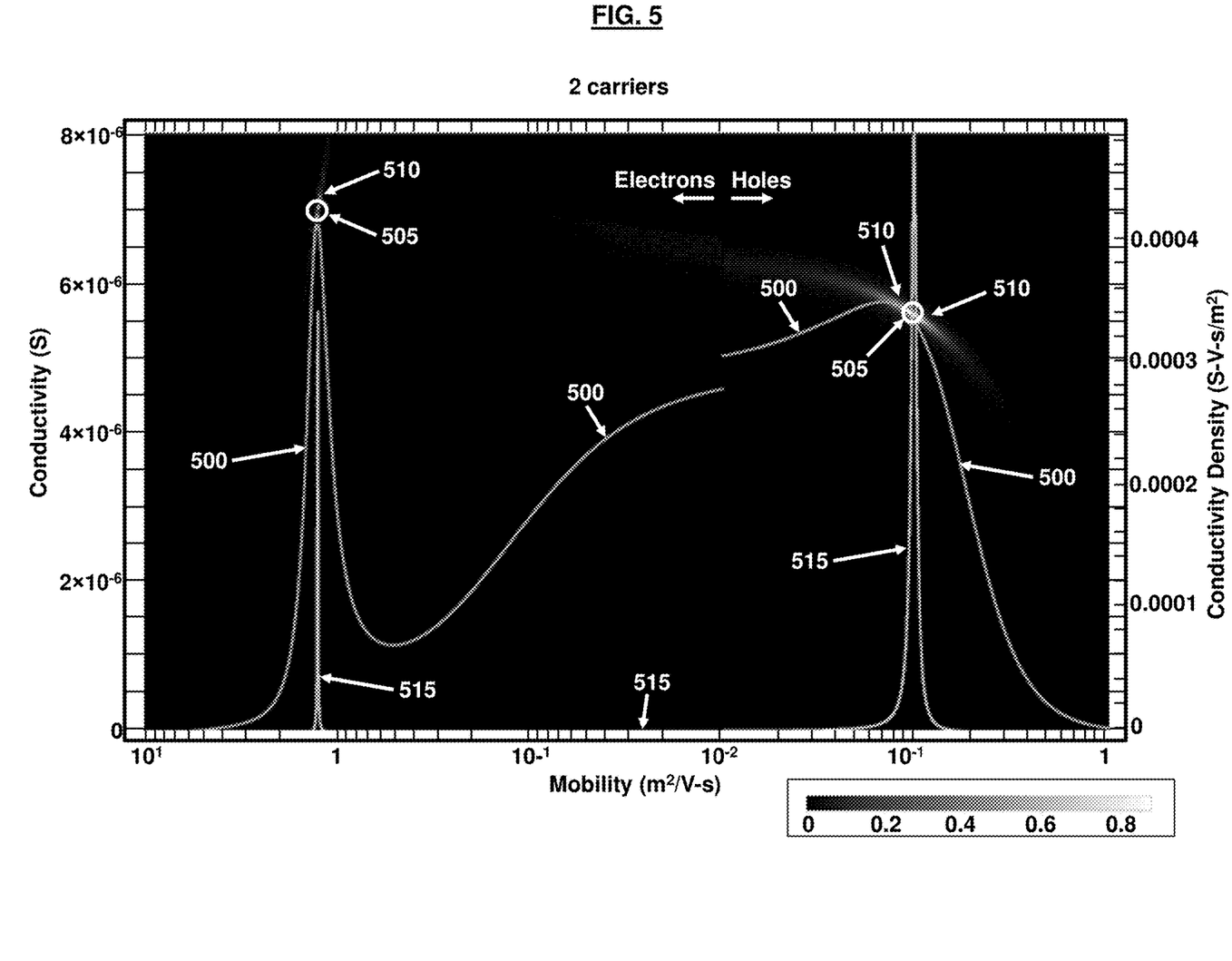
FIG. 5 is plot illustrating the original envelope mobility spectrum, 2-carrier fit, 2-carrier MMSA regions, and maximum-entropy spectrum for a p-type InAsSb sample, according to an exemplary embodiment herein.

FIG. 5 shows an example from measured Hall data from a p-type InAsSb sample, including analysis by the original envelope mobility spectrum (denoted by line 500), 2-carrier fit (denoted by circles 505), 2-carrier MMSA (denoted by regions 510), and the maximum-entropy spectrum (denoted by line 515) and method provided by the embodiments herein. In FIG. 5, the maximum-entropy spectrum 515 uses the right (conductivity density) axis, while all the other parameters use the left (conductivity) axis. The "bright areas" denoted by the regions 510 in the MMSA indicate a high probability (e.g., based on a scale of 0 to 1) of carriers at those areas. In this case the initial measured data was slightly unphysical, so the procedure further described below was used before calculation of the maximum entropy spectrum. The minimum eigenvalue was chosen so that the $\chi^2$ for the difference between the positive-definite approximation and closest 2-carrier fit was approximately equal to the $\chi^2$ for the difference between the original data and closest 2-carrier fit. In other words, the positive definite approximation was about as far inside the physical boundary of FIG. 2 as the original data was outside the physical boundary. The peaks in the original envelope spectrum are quite broad, but the peaks in the maximum-entropy spectrum are much narrower. The positions of the maximum-entropy peaks agree with both the 2-carrier fit and with the "bright areas" in the MMSA. Furthermore, the widths of the maximum-entropy peaks are comparable to the widths of the corresponding MMSA bright areas. This confirms that, when the minimum eigenvalue is chosen to yield $\chi^2$ as described above, the MMSA and maximum-entropy yield consistent and complimentary results.

Maximum Entropy Solution

The full set of solutions are described with reference to the truncated Hamburger moment problem (and corresponding mobility spectrum problem) in terms of Nevanlinna functions and also a full maximum-entropy solution. The canonical subset of those solutions that are equivalent to N-carrier solutions; i.e., solutions with carriers at only N discrete mobilities are described, and it is shown that there is a continuum of such solutions, all which yield an exact fit to physical Hall data. Finally, the N-carrier solutions are combined into an unbiased maximum-entropy solution that includes all of the N-carrier solutions with equal likelihood.

The entire family of solutions to the truncated Hamburger moment problem can be written in terms of Nevanlinna functions. That full set of solutions involves complex functions and is difficult to apply to real numerical data. Alternatively, a full, maximum-entropy solution for $g(\mu)$ from its moments may be described in terms of the exponential of a polynomial of degree (2N−1). The iterative procedure to determine the polynomial coefficients only reliably converges for relatively small N.

However, a subset of the full Nevanlinna solutions are the "canonical" solutions, for which $g(\mu)$ is non-zero at only a finite number of $\mu_i$, which correspond to Hall solutions with a finite number of discrete carriers. In particular, for cases in which the matrix of moments is positive definite, the canonical solutions comprise of sets of N discrete carriers. The Nevanlinna approach provides a useful way to parameterize the solutions in terms of a single parameter $\nu$ that ranges over the real axis. Specifically, the values of $\mu_i$ at which the canonical solutions are non-zero (corresponding to the mobilities of the N carriers) are the solutions of:

$$bh_{N-2}(\mu)-(\mu+\nu)h_{N-1}(\mu)=0, \quad (15)$$

where $h_n(\mu)$ are a set of orthogonal polynomials obtained by the Gram-Schmidt procedure:

$$h_n(\mu) = \frac{1}{\sqrt{\Delta_{n-1}\Delta_n}} \det\begin{pmatrix} m_0 & m_1 & \cdots & m_N \\ m_1 & m_2 & \cdots & m_{N+1} \\ \vdots & \vdots & \vdots & \vdots \\ m_{N-1} & m_N & \cdots & m_{2N-1} \\ 1 & \mu & \cdots & \mu^N \end{pmatrix} \quad (16)$$

where:

$$\Delta_j = \det\begin{pmatrix} m_0 & m_1 & \cdots & m_N \\ m_1 & m_2 & \cdots & m_{N+1} \\ \vdots & \vdots & \vdots & \vdots \\ m_j & m_{j+1} & \cdots & m_{2j} \end{pmatrix}, \quad (17)$$

while $\Delta_{-1}=1$ and $h_0(z)=m_0^{-1/2}$. b is the ratio of the highest-order coefficients in $h_{N-2}(\mu)$ and $h_{N-1}(\mu)$, i.e., if $$h_j(\mu) = \sum_{i=0}^{j} a_{ji}\mu^i$$

then $b = a_{N-2,N-2}/a_{N-1,N-1}$. There is then a one-to-one correspondence between $v$ and a particular set of N-carrier mobilities. Solving Eq. (15) for $v$ yields:

$$v = \frac{-bh_{N-2}(\mu) + \mu h_{N-1}(\mu)}{h_{N-1}(\mu)}, \quad (18)$$

which associates any $\mu$ with the corresponding $v$. It can also be shown that the conductivity at each of the mobilities is equal to $s(\mu)$ from the original envelope mobility spectrum in Eq. (6).

Since $h_n(\mu)$ are polynomials, it is easy to compute $dv/d\mu$ at any $\mu$. Each $v$ corresponds to a set of N carriers at $\{\mu_1(v), \mu_2(v), \ldots, \mu_N(v)\}$, and if it is defined that:

$$g(\mu) = p(v)s(\mu)dv/d\mu \quad (19)$$

for some weighting function $p(v)$, an interval $\delta v$ around $v$ will correspond to conductivities of $p(v)\{s(\mu_1), s(\mu_2), \ldots, s(\mu_N)\}\delta v$ at the mobilities $\{\mu_1(v), \mu_2(v), \ldots, \mu_N(v)\}$. In other words, the conductivity in each interval $\delta v$ is equal to $p(v)\delta v$ times an exact solution for the Hall data. For any normalized $p(v)$ with $$\int_{-\infty}^{\infty} g(\mu)d\mu = m_0, g(\mu)$$

will also be an exact solution for the Hall data.

The method next selects $p(v)$ to maximize the entropy in $g(\mu)$. For a function with no constraints, the entropy is maximized by a constant function, which would correspond to a constant $s(\mu)dv/d\mu$. However, $g(\mu)$ is constrained by Eq. (19), which enforces ratios between the values of the function at each component of an N-carrier set. So instead of using a $p(v)$ that yields constant $s(\mu)dv/d\mu$, the method selects one in which the average value of $s(\mu)dv/d\mu$ over the N mobilities included in the N-carrier solution remains constant. This is accomplished by choosing:

$$g(\mu) = \kappa s(\mu)(dv/d\mu) \bigg/ \sum_{i=1}^{N} s[\mu_i(v)](dv/d\mu_i) \quad (20)$$

where $\kappa$ is a normalization constant chosen to yield $$\int_{-\infty}^{\infty} g(\mu)d\mu = m_0.$$

The resultant $g(\mu)$ is a maximum-entropy combination of N-carrier solutions that has the required moments. The corresponding mobility spectrum $s(\mu)$ can then be calculated from Eq. (12) by:

$$s(\mu) = g(\mu)\Pi_{p=1}^{N}(1 + H_p^2\mu^2). \quad (21)$$

Eq. (21) is a maximum-entropy combination of N-carrier solutions that exactly matches the Hall data. It weights all of the possible N-carrier solutions equally and is therefore an unbiased estimator of the mobility distribution in the sample.

Finding a Positive-Definite Approximation to Unphysical Data

The method for maximum-entropy combination of N-carrier solutions in the previous section can only be applied to positive-definite data. However, measured Hall data is often slightly unphysical, with one or more small negative eigenvalues. The embodiments herein provide a method to find a positive definite set of data that approximates the measured data. The method is based on the technique used for the method for multicarrier mobility spectrum analysis. The MMSA uses an alternating projection method to alternately find the closest whitened positive semi-definite A-matrix (which no longer has Hankel symmetry) and then the closest Hankel matrix (which is no longer positive semi-definite). That method converges to a positive semi-definite Hankel matrix, which corresponds to the closest physical set of Hall data. The method provided by the embodiments herein uses a similar alternating projection method, but alternately finds the closest whitened matrix with some minimum positive eigenvalue and then closest Hankel matrix. The method converges to a closest positive definite Hankel matrix with some minimum positive eigenvalue.

Method for Symmetric Whitening

The procedure to find the closest positive-definite matrix with some minimum positive eigenvalue further described below requires a whitened, symmetric matrix. Therefore, the raw A-matrix calculated from Eq. (3) is converted to a matrix with the same inertia, but with whitened noise as defined by Eq. (13). The MMSA method used a Monte Carlo process to determine $\Omega_0 = \langle (\delta A_0^T)(\delta A_0) \rangle$, while the method provided by the embodiments herein uses a faster and more accurate closed-form result. The full symmetric whitening is accomplished by the following iterative process:

(1) Compute the mean square deviation of the data A-matrix as $$\Omega_0 = \langle (\delta A_0^T)(\delta A_0) \rangle = \sum_{i=1}^{N} \lambda_i (V_0)_i \square (V_0)_i,$$

where $\lambda_i$ is the $i^{th}$ eigenvalue of the covariance matrix $X_a$, and $(V_0)_i$ is the Hankel matrix corresponding to the $i^{th}$ eigenvector $v_i$, i.e., $[(V_0)_i]_{jk} = (v_i)_{j+k-1}$.

(2) Whiten each of the $(V_0)_i$ by $(V_{w0})_i = \Omega_0^{1/4}(V_0)_i\Omega_0^{1/4}$, where $\Omega_0^{1/4}$ indicates the matrix fourth root of $\Omega_0$. Since $\Omega_0^{1/4}$ has all positive eigenvalues, $\Omega_0^{1/4}$ can be computed by simply taking the fourth root of its eigenvalues. This yields symmetric $(V_{w0})_i$ [and $(\delta A_{w0})$] that are approximately whitened.

(3) Repeat step 1 but using $(V_{w0})_i$ on the right-hand side instead of $(V_0)_i$ to obtain $$\Omega_1 = \langle (\delta A_{w0}^T)(\delta A_{w0}) \rangle = \sum_{i=1}^{N} \lambda_i (V_{w0})_i \square (V_{w0})_i.$$

Then repeat step 2 to obtain $(V_{w1})_i = \Omega_1^{1/4}(V_{w0})_i\Omega_1^{1/4}$.

(4) Repeat step 3 for M iterations to finally obtain $$\Omega_M = \langle (\delta A_{w(M-1)}^T)(\delta A_{w(M-1)}) \rangle = \sum_{i=1}^{N} \lambda_i (V_{w(M-1)})_i \square (V_{w(M-1)})_i.$$

The final whitening matrix is then $$W = \prod_{j=0}^{M} \Omega_j^{1/4},$$

such that $A_W = W^T A W$ is whitened and symmetric.

Perfect whitening as defined in Eq. (13) would require a large number of iterations. But perfect whitening is not necessary. It is known that M=10 yields good results and only requires a few seconds of computing time. Furthermore, as stated previously, this derivation of the whitening matrix W need only be performed once at the beginning of a measurement analysis.

If $\delta A_W$ is the difference between the whitened data A-matrix and some other whitened physical A-matrix, the $\chi_{mat}^2$ for the difference is:

$$\chi_{mat}^2 = Tr[(\delta A_W^T)(\delta A_W)], \quad (22)$$

where Tr[M] is the trace of the matrix M. The "mat" subscript is used on $\chi_{mat}^2$ to differentiate this $\chi^2$ from the one defined in Eq. (5) from the covariance of the vector a since the two $\chi^2$ are not equivalent. Numerical experiments have shown that both Eq. (5) and Eq. (22) yield $\chi^2$ distributions when applied to Monte Carlo data sets. However, the $\chi^2$ from Eq. (5) has (2N−1) degrees of freedom while $\chi_{mat}^2$ has N degrees of freedom. Both are statistically meaningful descriptors, but $\chi_{mat}^2$, is the more appropriate measure for the whitened matrices used for the MMSA and for the new method provided by the embodiments herein.

Alternate Projection to Find Positive-Definite A-Matrix

A positive-definite $A_{pw}$ is next determined with some minimum positive whitened eigenvalue $\lambda_{min}$ that is close to the unphysical measured $A_{dW}$. The alternating projection technique is an established method to find the closest member of a set that simultaneously satisfies two convex constraints when it is known how to find the closest member that satisfies each constraint separately. In this case, the constraints on $A_{pW}$ are that 1) it have a set of positive eigenvalues with the minimum eigenvalue being $\lambda_{min}$ and 2) that its unwhitened version $A = W^{-1} A_{pW} W^{-T}$ be a Hankel matrix. The set of positive-definite matrices with all eigenvalues greater than $\chi_{min}$ is not necessarily convex. However, the set of positive-definite matrices (with all eigenvalues greater than zero) is convex. Therefore, although alternating projection is not guaranteed to find a unique, closest $A_{pW}$, the near-convexity yields convergence in all cases that have been tested. The fact that the result may not necessarily be a unique closest result is not a problem since a representative, unbiased result is determined, not a unique one.

The alternating projection method proceeds by alternately finding the solution that meets the first constraint, and then the closest solution to that that satisfies the second constraint, then the closest solution to that that meets the first constraint again, and so forth. Eventually, the method converges to a closest solution that satisfies both constraints. The methods described below find the closest positive-definite matrix with minimum eigenvalue $\lambda_{min}$ and then find the closest whitened Hankel matrix.

Method to Find Closest Positive Definite Matrix with Minimum Eigenvalue

There is a known method to find the closest non-negative definite symmetric matrix when the "closeness" is determined by the Frobenius norm of the difference between the matrices, which is the situation that occurs after the symmetric whitening as detailed above. Here, that method is adapted to find the closest positive-definite matrix with minimum $\lambda_{min}$. The method is to:

(1) Perform an eigenvalue expansion $A_W = X^T \Gamma X$, where the columns of X are the eigenvectors of $A_W$ and $\Gamma$ is a diagonal matrix containing the eigenvalues of $A_W$.

(2) Replace any eigenvalues less than $\chi_{min}$ in $\Gamma$ with $\chi_{min}$ to produce $\Gamma_0$ and then compute the closest positive definite matrix as $A_{W0} = X^T \Gamma_0 X$.

Method to Find Closest Whitened Hankel Matrix

For the second constraint, the method determines the closest whitened Hankel matrix $A_{WH}$ to some $A_W$ by minimizing $|A_W - A_{WH}|^2$, where $A_{WH} = W^T H W$, and H is a Hankel matrix. From the Hankel symmetry, $$(A_{WH})_{ij} = (W^T H W)_{ij} = \sum_{r,s=1}^{N} W_{ir} H_{rs} W_{sj} = \sum_{r,s=1}^{N} W_{ir} h_{r+s-1} W_{sj}, \quad (23)$$

where h is the vector form of H. Eq. (23) is a linear relationship between the (2N−1) elements of h and the $N^2$ elements of $A_{WH}$. If the method then vectorizes $A_{WH}$ by defining $(\rho_{WH})_{(i-1)N+j} = (A_{WH})_{ij}$, Eq. (23) becomes:

$$\rho_{WH} = \Omega \cdot h, \quad (24)$$

where $\Omega$ is an $N^2 \times (2N-1)$ matrix defined by:

$$\Omega_{tk} = \sum_{r=max[1,k-N+1]}^{min[k,N]} W_{floor[t-1/N],r} W_{mod[t-1,N],k-r+1}, \quad (25)$$

and where min[x,y] is the minimum of x and y, max[x,y] is the maximum of x and y, floor[x] is the largest integer less than or equal to x, and mod[m,n] is the remainder on division of m by n. In this vectorized form of Eq. (24), the method minimizes $|\rho_W - \rho_{WH}|^2 = |\rho_W - \Omega \cdot h|^2$, where $\rho_W$ is the vectorized form of the original $A_W$. It is well-known that the solution for h that minimizes $|\rho_W - \Omega \cdot h|^2$ is:

$$h = \Omega^+ \cdot \rho_W, \quad (26)$$

where $h = \Omega^+ \cdot \rho_W$ is the generalized matrix inverse (also called pseudoinverse) of $\Omega$, so the matrix $H_{ij} = h_{i+j-1}$ is the required closest whitened Hankel matrix to the original $A_W$.

With methods established to find the closest matrices that satisfy the constraints separately, the alternating projection method can be used to find the closest matrix that satisfies both constraints. In an example, the alternating projection is iterated until the $\chi_{mat}^2$, of the solution changes less than some fractional amount $\Delta\chi^2$ in the last iteration. A cutoff value of $\Delta\chi^2/\chi^2 = 0.001$ usually works well.

Figure 6:
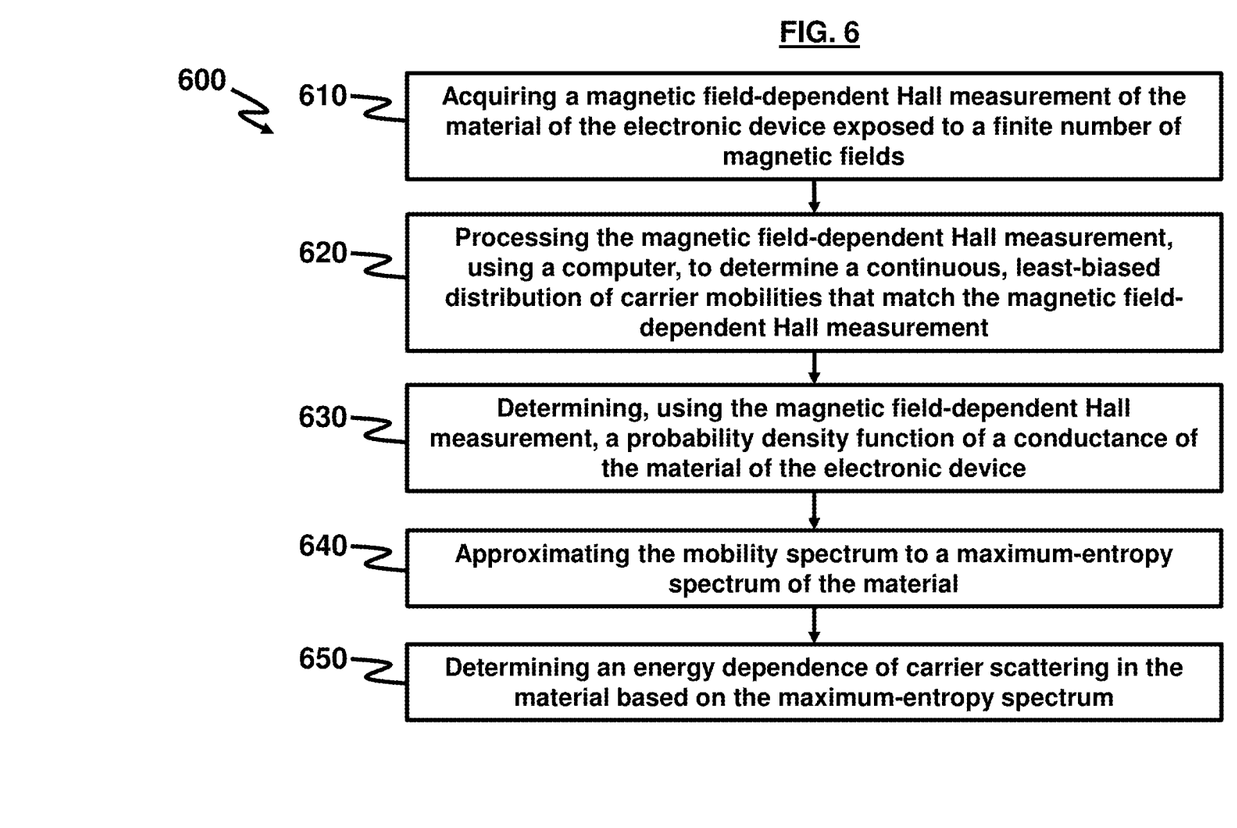
FIG. 6 is a flowchart illustrating a method for determining a distribution of carrier mobilities in a material of an electronic device, according to an embodiment herein.

FIG. 6 is a flowchart illustrating a method 600 for determining a distribution of carrier mobilities in a material of an electronic device, the method 600 comprising acquiring (610) a magnetic field-dependent Hall measurement of the material of the electronic device exposed to a finite number of magnetic fields, wherein the magnetic field-dependent Hall measurement comprises an electrical signal generated in response to the finite number of magnetic fields being applied perpendicular to a current through the material; and processing (620) the magnetic field-dependent Hall measurement, using a computer, to determine a continuous, least-biased distribution of carrier mobilities that match the magnetic field-dependent Hall measurement by: determining (630), using the magnetic field-dependent Hall measurement, a probability density function of a conductance of the material of the electronic device; approximating (640) the mobility spectrum to a maximum-entropy spectrum of the material; and determining (650) an energy dependence of carrier scattering in the material based on the maximum-entropy spectrum, wherein the final maximum-entropy mobility spectrum identifies a least-biased estimate of the distribution of the carrier mobilities in the material. According to an example, the energy dependence may identify a cause of limitations in the carrier mobilities in the material, which provides information of how to improve the growth of the material; e.g., through material impurities, etc.

The method 600 may further comprise determining a source of a dominant carrier scattering in the material based on the energy dependence. The method 600 may further comprise plotting a representation of the mobility spectrum comprising peaks comprising (i) a position and amplitude that indicates the carrier mobilities and densities of the discrete carriers, and (ii) a width that are directly indicative experimental uncertainties in the carrier mobilities. The finite number of magnetic fields may comprise seven or fewer magnetic fields. Positive-definite Hall data of the magnetic field-dependent Hall measurement may be exactly fit by one-dimensional continuum of N-carrier sets, and wherein N is an integer. The magnetic field-dependent Hall measurement may comprise physical data and unphysical data, and the method may comprise converting the unphysical data to a positive definite approximation of the unphysical data.

The converting of the unphysical data to the positive definite approximation of the unphysical data may comprises (a) determining a closest whitened positive-definite A-matrix with a minimum positive eigenvalue; (b) determining a closest Hankel matrix; and (c) determining a positive-definite Hankel matrix corresponding to a closest physical set of Hall data based on (a) and (b). The whitened positive-definite A-matrix with a minimum positive eigenvalue may depend on noise in the magnetic field-dependent Hall measurement. The probability density function may describe a mobility spectrum of a linear combination of discrete carriers. The probability density function may describe a mobility spectrum of a linear combination of continuous carriers.

Certain types of magnetic field-dependent Hall data (physical data) can be exactly described by a continuum of N-carrier solutions, where N is the number of magnetic fields used in the measurement. Accordingly, the method 600 combines those N-carrier solutions into a composite solution in a way that yields maximum entropy and therefore a least-biased representation of the conductance in the material. Additionally, the method 600 provides a way to convert measured, unphysical data into a physical approximation that can be analyzed using the maximum-entropy method.

The embodiments herein may be embodied as a computer program product configured to include a pre-configured set of instructions, which when performed, can result in actions as stated in conjunction with the methods described above. In an example, the pre-configured set of instructions can be stored on a tangible non-transitory computer readable medium or a program storage device. In an example, the tangible non-transitory computer readable medium can be configured to include the set of instructions, which when performed by a device, can cause the device to perform acts similar to the ones described here. Embodiments herein may also include tangible and/or non-transitory computer-readable storage media for carrying or having computer executable instructions or data structures stored thereon. Such non-transitory computer readable storage media can be any available media that can be accessed by a special purpose device, including the functional design of any special purpose processor as discussed above.

By way of example, and not limitation, such non-transitory computer-readable media can include RAM, ROM, EEPROM, CD-ROM or other optical disk storage, magnetic disk storage or other magnetic storage devices, or any other medium which can be used to carry or store desired program code means in the form of computer executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a special purpose device to perform a certain function or group of functions. Computer-executable instructions also include program modules that are executed by computers in stand-alone or network environments. Generally, program modules include routines, programs, components, data structures, objects, and the functions inherent in the design of special-purpose devices, etc. that perform particular tasks or implement particular abstract data types. Computer executable instructions, associated data structures, and program modules represent examples of the program code means for executing steps of the methods disclosed herein. The particular sequence of such executable instructions or associated data structures represents examples of corresponding acts for implementing the functions described in such steps.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor, and may be configured, for example, as a kiosk.

The embodiments herein can include both hardware and software elements. The embodiments that are implemented in software include but are not limited to, firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device. For example, the analysis provided by the embodiments herein may be implemented in a software package with a graphical user interface that can load Hall data and compute and compare multi-carrier fits, conventional envelope mobility spectrum, MMSA, and the maximum-entropy spectrum. The solution may allow to save data plots or the plot data for external plotting.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 7:
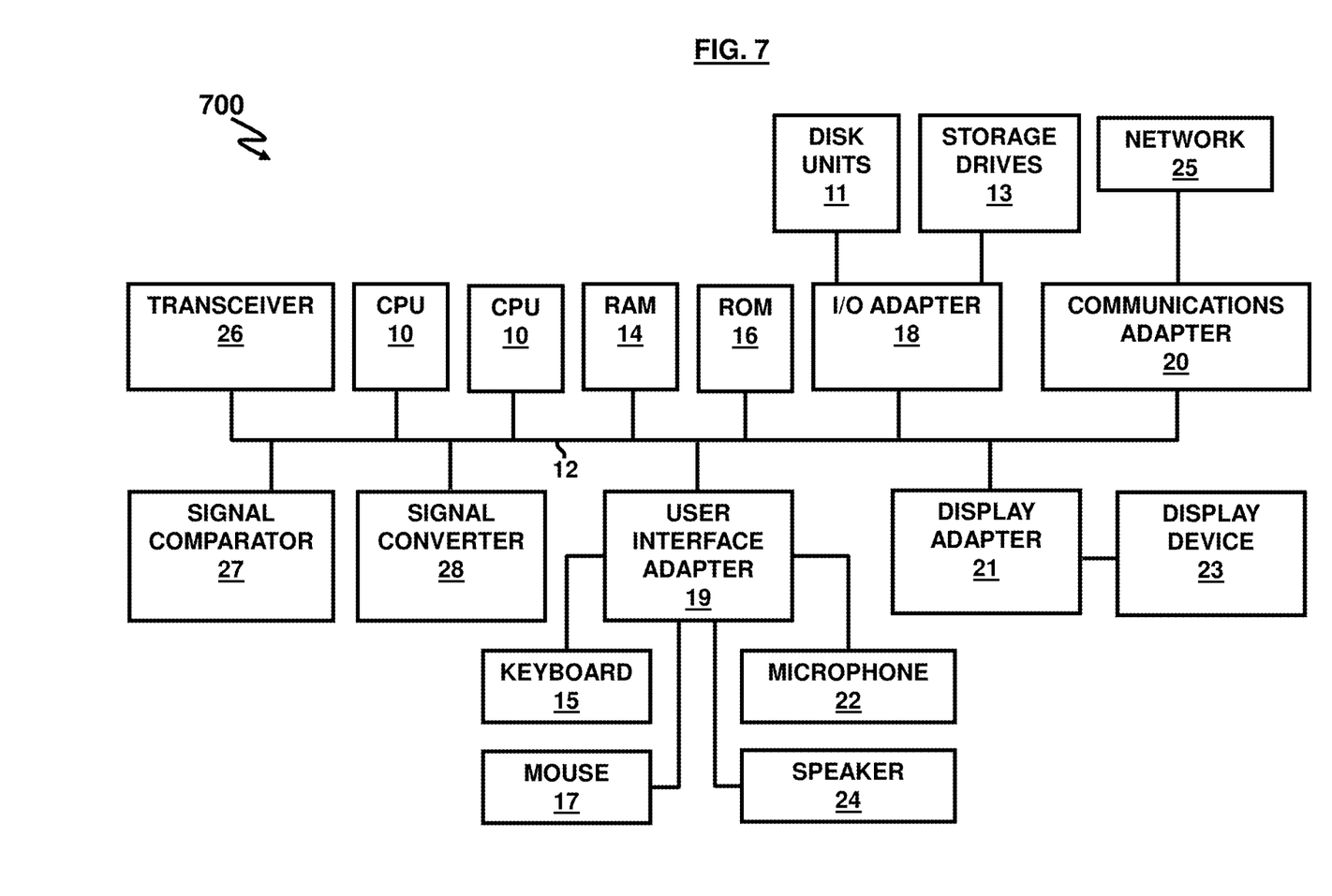
FIG. 7 is a schematic diagram illustrating an exemplary computer architecture, according to an embodiment herein.

A representative hardware environment for practicing the embodiments herein is depicted in FIG. 7. This schematic drawing illustrates a hardware configuration of an information handling/computer system 700 in accordance with the embodiments herein. The system 700 comprises at least one processing device 10. The special-purpose CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system 700 can read the inventive instructions on the program storage devices and follow these instructions to execute the methodology of the embodiments herein. The system 700 further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example. Further, a transceiver 26, a signal comparator 27, and a signal converter 28 may be connected with the bus 12 for processing, transmission, receipt, comparison, and conversion of electric or electronic signals.

The embodiments herein analyze magnetic field-dependent Hall data from a sample with a continuous mobility distribution to determine a least-biased continuous mobility spectrum that matches the Hall data. Moreover, the embodiments herein use the above to determine the energy dependence of carrier scattering in a material and thereby determine the dominant scattering mechanism. Furthermore, the embodiments herein analyze magnetic field-dependent Hall data from a sample with a set of discreet or continuous carriers to determine a spectrum that matches the Hall data and has peaks whose position and amplitude indicates the mobilities and densities of the carriers, and whose widths indicate the experimental uncertainties in the mobilities.

The embodiments herein further identify the connection between the problem of recovering the mobility spectrum from Hall data at a finite number of magnetic fields and the truncated Hamburger moment problem. Additionally, the embodiments herein identify that positive-definite Hall data can be exactly fit by a one-dimensional continuum of N-carrier sets. Moreover, the embodiments herein combine the N-carrier sets in a way that all of the sets are equally likely in order to achieve a continuous, unbiased, maximum-entropy mobility spectrum. Furthermore, the embodiments herein provide a technique for finding physical, positive-definite Hall data that is "close" to a measured set of slightly unphysical Hall data that allows the above-described maximum-entropy method to be used with initially unphysical measured Hall data.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for determining a distribution of carrier mobilities in a material of an electronic device, the method comprising:
    acquiring a magnetic field-dependent Hall measurement of the material of the electronic device exposed to a finite number of magnetic fields, wherein the magnetic field-dependent Hall measurement comprises an electrical signal generated in response to the finite number of magnetic fields being applied perpendicular to a current through the material; and processing the magnetic field-dependent Hall measurement, using a computer, to determine a continuous, least-biased distribution of carrier mobilities that match the magnetic field-dependent Hall measurement by:

determining, using the magnetic field-dependent Hall measurement, a probability density function of a conductance of the material of the electronic device;

approximating the mobility spectrum to a maximum-entropy spectrum of the material; and determining an energy dependence of carrier scattering in the material based on the maximum-entropy spectrum, wherein the maximum-entropy mobility spectrum identifies a least-biased estimate of a distribution of the carrier mobilities in the material.

2. The method of claim 1, comprising determining a source of a dominant carrier scattering in the material based on the energy dependence.

3. The method of claim 1, comprising plotting a representation of the mobility spectrum comprising peaks comprising (i) a position and amplitude that indicates the carrier mobilities and densities of the discrete carriers, and (ii) a width that are directly indicative experimental uncertainties in the carrier mobilities.

4. The method of claim 1, wherein the finite number of magnetic fields comprise seven or fewer magnetic fields.

5. The method of claim 1, wherein positive-definite Hall data of the magnetic field-dependent Hall measurement is exactly fit by one-dimensional continuum of N-carrier sets, and wherein N is an integer.

6. The method of claim 1, wherein the magnetic field-dependent Hall measurement comprises physical data and unphysical data, and wherein the method comprises converting the unphysical data to a positive definite approximation of the unphysical data.

7. The method of claim 6, wherein the converting of the unphysical data to the positive definite approximation of the unphysical data comprises:
(a) determining a closest whitened positive definite A-matrix with a minimum positive eigenvalue;
(b) determining a closest Hankel matrix; and
(c) determining a positive definite Hankel matrix corresponding to a closest physical set of Hall data based on (a) and (b).

8. The method of claim 7, wherein the whitened positive definite A-matrix with a minimum positive eigenvalue depends on noise in the magnetic field-dependent Hall measurement.

9. The method of claim 1, wherein the probability density function describes a mobility spectrum of a linear combination of discrete carriers.

10. The method of claim 1, wherein the probability density function describes a mobility spectrum of a linear combination of continuous carriers.

11. A non-transitory program storage device readable by computer, and comprising a program of instructions executable by the computer to perform a method for determining a distribution of carrier mobilities in a material of an electronic device, the method comprising:

acquiring a magnetic field-dependent Hall measurement of the material of the electronic device exposed to a finite number of magnetic fields, wherein the magnetic field-dependent Hall measurement comprises an electrical signal generated in response to the finite number of magnetic fields being applied perpendicular to a current through the material; and processing the magnetic field-dependent Hall measurement, using a computer, to determine a continuous, least-biased distribution of carrier mobilities that match the magnetic field-dependent Hall measurement by:

determining, using the magnetic field-dependent Hall measurement, a probability density function of a conductance of the material of the electronic device;

approximating the mobility spectrum to a maximum-entropy spectrum of the material; and determining an energy dependence of carrier scattering in the material based on the maximum-entropy spectrum, wherein the maximum-entropy mobility spectrum identifies a least-biased estimate of a distribution of the carrier mobilities in the material.

12. The program storage device of claim 11, wherein the method further comprises determining a source of a dominant carrier scattering in the material based on the energy dependence.

13. The program storage device of claim 11, wherein the method further comprises plotting a representation of the mobility spectrum comprising peaks comprising (i) a position and amplitude that indicates the carrier mobilities and densities of the discrete carriers, and (ii) a width that are directly indicative experimental uncertainties in the carrier mobilities.

14. The program storage device of claim 11, wherein the finite number of magnetic fields comprise seven or fewer magnetic fields.

15. The program storage device of claim 11, wherein positive-definite Hall data of the magnetic field-dependent Hall measurement is exactly fit by one-dimensional continuum of N-carrier sets, and wherein N is an integer.

16. The program storage device of claim 11, wherein the magnetic field-dependent Hall measurement comprises physical data and unphysical data, and wherein the method comprises converting the unphysical data to a positive definite approximation of the unphysical data.

17. The program storage device of claim 16, wherein the converting of the unphysical data to the positive definite approximation of the unphysical data comprises:
(a) determining a closest whitened positive definite A-matrix with a minimum positive eigenvalue;
(b) determining a closest Hankel matrix; and
(c) determining a positive definite Hankel matrix corresponding to a closest physical set of Hall data based on (a) and (b).

18. The program storage device of claim 17, wherein the whitened positive definite A-matrix with a minimum positive eigenvalue depends on noise in the magnetic field-dependent Hall measurement.

19. The program storage device of claim 11, wherein the probability density function describes a mobility spectrum of a linear combination of discrete carriers.

20. The program storage device of claim 11, wherein the probability density function describes a mobility spectrum of a linear combination of continuous carriers.

* * * * *